(12) United States Patent
Osame et al.

(10) Patent No.: US 7,173,586 B2
(45) Date of Patent: Feb. 6, 2007

(54) ELEMENT SUBSTRATE AND A LIGHT EMITTING DEVICE

(75) Inventors: Mitsuaki Osame, Kanagawa (JP); Aya Anzai, Kanagawa (JP); Yu Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 482 days.

(21) Appl. No.: 10/807,978

(22) Filed: Mar. 24, 2004

(65) Prior Publication Data

US 2004/0189615 A1 Sep. 30, 2004

(30) Foreign Application Priority Data

Mar. 26, 2003 (JP) .............................. 2003-086605
May 16, 2003 (JP) .............................. 2003-139563

(51) Int. Cl.
*G09G 3/32* (2006.01)
(52) U.S. Cl. .......................................... 345/82; 345/76
(58) Field of Classification Search ................. 345/82, 345/83, 76, 77
See application file for complete search history.

(56) References Cited

U.S. PATENT DOCUMENTS

| | | | |
|---|---|---|---|
| 4,356,429 A | 10/1982 | Tang ........................... | 313/503 |
| 4,539,507 A | 9/1985 | VanSlyke et al. ............ | 313/504 |
| 4,720,432 A | 1/1988 | VanSlyke et al. ............ | 428/457 |
| 4,769,292 A | 9/1988 | Tang et al. ................... | 428/690 |
| 4,885,211 A | 12/1989 | Tang et al. ................... | 428/457 |
| 4,950,950 A | 8/1990 | Perry et al. .................. | 313/504 |
| 5,047,687 A | 9/1991 | VanSlyke ..................... | 313/503 |
| 5,059,861 A | 10/1991 | Littman et al. .............. | 313/503 |

(Continued)

FOREIGN PATENT DOCUMENTS

EP 0 717 445 6/1996

(Continued)

OTHER PUBLICATIONS

Zou, D. et al, "Improvement of Current-Voltage Characteristics in Organic Light Emitting Diodes by Application of Reversed-Bias Voltage," Jpn. Appl. Phys., vol. 37, Part 2, No. 11B pp. L1406-L1408, Nov. 15, 1998.

(Continued)

*Primary Examiner*—Ricardo Osorio
(74) *Attorney, Agent, or Firm*—Cook, Alex, McFarron, Manzo, Cummings & Mehler, Ltd.

(57) ABSTRACT

A light emitting device and an element substrate which are capable of suppressing variations in the luminance intensity of a light emitting element among pixels due to characteristic variations of a driving transistor without suppressing off-current of a switching transistor low and increasing storage capacity of a capacitor. According to the invention, a driving transistor also serves as an erasing transistor and the driving transistor is operated in a saturation region. The gate of the driving transistor is connected to an erasing scan line and it can be selected whether or not to flow current by a potential of the erasing scan line. In addition, a current controlling transistor which operates in a linear region is connected in series to the driving transistor, thus a video signal transmitting a light emission or non-emission of a pixel is input to the gate of the current controlling transistor through a switching transistor.

10 Claims, 13 Drawing Sheets

U.S. PATENT DOCUMENTS

| | | | | |
|---|---|---|---|---|
| 5,059,862 | A | 10/1991 | VanSlyke et al. | 313/503 |
| 5,061,617 | A | 10/1991 | Maskasky | 430/569 |
| 5,073,446 | A | 12/1991 | Scozzafava et al. | 428/323 |
| 5,151,629 | A | 9/1992 | VanSlyke | 313/504 |
| 5,247,190 | A | 9/1993 | Friend et al. | 257/40 |
| 5,294,869 | A | 3/1994 | Tang et al. | 313/504 |
| 5,294,870 | A | 3/1994 | Tang et al. | 313/504 |
| 5,399,502 | A | 3/1995 | Friend et al. | 437/1 |
| 5,641,991 | A | 6/1997 | Sakoh | 257/755 |
| 5,714,968 | A | 2/1998 | Ikeda | 345/77 |
| 5,839,456 | A | 11/1998 | Han | 134/104.1 |
| 5,882,761 | A | 3/1999 | Kawami et al. | 428/69 |
| 5,990,629 | A | 11/1999 | Yamada et al. | 315/169.3 |
| 6,011,529 | A | 1/2000 | Ikeda | 345/77 |
| 6,087,245 | A | 7/2000 | Yamazaki et al. | 438/486 |
| 6,165,824 | A | 12/2000 | Takano et al. | 438/160 |
| 6,229,506 | B1 | 5/2001 | Dawson et al. | 345/82 |
| 6,236,064 | B1 | 5/2001 | Mase et al. | 257/72 |
| 6,246,180 | B1 | 6/2001 | Nishigaki | 315/169.3 |
| 6,246,384 | B1 | 6/2001 | Sano | 345/76 |
| 6,366,025 | B1 | 4/2002 | Yamada | 315/169.3 |
| 6,433,485 | B2 | 8/2002 | Tai et al. | 315/169.2 |
| 6,440,877 | B1 | 8/2002 | Yamazaki et al. | 438/780 |
| 6,528,950 | B2 | 3/2003 | Kimura | 315/169.3 |
| 6,583,775 | B1 | 6/2003 | Sekiya et al. | 345/76 |
| 6,730,966 | B2 | 5/2004 | Koyama | 257/350 |
| 6,927,618 | B2 * | 8/2005 | Kimura et al. | 327/427 |
| 2001/0030704 | A1 | 10/2001 | Kimura | 348/308 |
| 2002/0021266 | A1 | 2/2002 | Koyama et al. | 345/76 |
| 2002/0047120 | A1 | 4/2002 | Inukai | 257/59 |
| 2002/0196389 | A1 | 12/2002 | Koyama | 349/69 |
| 2003/0016190 | A1 | 1/2003 | Kondo | 345/55 |
| 2003/0222589 | A1 | 12/2003 | Osame et al. | 315/169.1 |

FOREIGN PATENT DOCUMENTS

| | | |
|---|---|---|
| EP | 0 776 147 A1 | 5/1997 |
| EP | 0 778 556 | 6/1997 |
| EP | 1 061 497 | 12/2000 |
| EP | 1 107 220 A2 | 6/2001 |
| GB | 2 336 459 | 10/1999 |
| JP | 08-078159 | 3/1996 |
| JP | 08-241048 | 9/1996 |
| JP | 09-148066 | 6/1997 |
| JP | 10-092576 | 4/1998 |
| JP | 10-189525 | 7/1998 |
| JP | 10-214060 | 8/1998 |
| JP | 10-232649 | 9/1998 |
| JP | 10-247735 | 9/1998 |
| JP | 10-312173 | 11/1998 |
| JP | 2000-221942 | 8/2000 |
| JP | 2000-235370 | 8/2000 |
| JP | 2000-347621 | 12/2000 |
| JP | 2001-042822 | 2/2001 |
| JP | 2001-060076 | 3/2001 |
| JP | 2003-295793 | 10/2003 |
| WO | WO 90/13148 | 11/1990 |
| WO | WO 98/48403 | 10/1998 |
| WO | WO 99/42983 | 8/1999 |
| WO | WO 99/49989 | 10/1999 |
| WO | WO 99/53472 | 10/1999 |

OTHER PUBLICATIONS

Schenk, H. et al, "Polymers for Light Emitting Diodes," EuroDisplay '99 Proceedings of the 19th International Display Research Conference, Berlin, Germany, Sep. 6-9, 1999, pp. 33-37.

Tsutsui, T. et al, 'Electroluminescence in Organic Thin Films,' Photochemical Processes in Organized Molecular Systems, pp. 437-450, Elsevier Science Publishers, Tokyo, (1991).

Baldo, M.A. et al, 'Highly Efficient Phosphorescent Emission from Organic Electroluminescent Devices,' Nature, vol. 395, pp. 151-154, Sep. 10, 1998.

Baldo, M.A. et al, 'Very High-Efficiency Green Organic Light-Emitting Devices Based on Electrophosphorescence,' Applied Physics Letters, vol. 75, No. 1, pp. 4-6, Jul. 5, 1999.

Tsutsui, T. et al, 'High Quantum Efficiency in Organic Light-Emitting Devices with Iridium-Complex as a Triplet Emissive Center,' Japanese Journal of Applied Physics, vol. 38, part 2, No. 12B, pp. L1502-L1504, Dec. 15, 1999.

Kanagu et al, "A 31-in.-Diagonal Full-Color Surface-Discharge ac Plasma Display Panel," SID 92 Digest, pp. 713-716, May 17, 1992.

Kawahara et al, "Simulation of Motion Picture Disturbance for AC-PDP Modeling Virtual Pixel on Retina," IEICE Transactions on Electronics, vol. E81-C, No. 11, pp. 1733-1739, Nov. 11, 1998.

* cited by examiner

ELEMENT SUBSTRATE AND A LIGHT EMITTING DEVICE

BACKGROUND OF THE INVENTION

1. Field of the Invention

The present invention relates to a light emitting device comprising a plurality of pixels each having a light emitting element and a means for supplying current to the light emitting element.

2. Description of the Related Art

Since a light emitting element emits light by itself, it is highly visible and does not require a back light which is needed in a liquid crystal display device (LCD). Therefore, it is suitably applied to thin devices and not restricted in viewing angle. Because of these advantages, a light emitting device having a light emitting element has recently been drawing attentions as an alternative display device to a CRT and an LCD. It is to be noted that a light emitting element in this specification indicates an element whose luminance is controlled by current or voltage, and it includes an OLED (Organic Light Emitting Diode) or an MIM electron source element (electron discharge element) and the like which is used in an FED (Field Emission Display).

Also, a light emitting device of the invention includes a panel and a module obtained by mounting an IC or the like onto the panel. More generally, the invention relates to an element substrate which corresponds to the one before the completion of a panel in manufacturing steps of the light emitting device, and the element substrate comprises a plurality of pixels each having a means for supplying current to a light emitting element.

OLED which is one of the light emitting elements includes an anode layer, a cathode layer, and a layer containing an electric field light emitting material (hereinafter referred to as an electroluminescent layer) that generates luminescence (electroluminescence) when an electric field is applied thereto. The electroluminescent layer is provided between an anode and cathode, and composed of a single layer or multiple layers. These layers may contain an inorganic compound. The electroluminescence by the electroluminescent layer includes a light emission (fluorescence) when a singlet exciting state returns to a ground state and a light emission (phosphorescence) when a triplet exciting state returns to a ground state.

Next, the configuration of a pixel of a general light emitting device and its drive will be described in brief. A pixel shown in FIG. 7 comprises a switching transistor 700, an erasing transistor 708, a driving transistor 701, a capacitor 702, and a light emitting element 703. The gate of the switching transistor 700 is connected to a first scan line 705. Either the source or the drain of the switching transistor 700 is connected to a signal line 704, and the other is connected to the gate of the driving transistor 701. The source of the driving transistor 701 is connected to a power supply line 706, and the drain of the driving transistor 701 is connected to the anode of the light emitting element 703. The gate of the erasing transistor 708 is connected to a second scanning line 709, the source thereof is connected to the power supply line 706, and the drain thereof is connected to the gate of the driving transistor 701. The cathode of the light emitting element 703 is connected to a counter electrode 707. The capacitor 702 is provided for storing a potential difference between the gate and the source of the driving transistor 701. Also, the predetermined voltages are applied to the power supply line 706 and the counter electrode 707 from a power supply and each has a potential difference.

When the switching transistor 700 is turned ON by a signal from the first scan line 705, a video signal that is input to the signal line 704 is input to the gate of the driving transistor 701. The potential difference between a potential of the input video signal and that of the power supply line 706 corresponds to a gate-source voltage Vgs of the driving transistor 701. Thus, current is supplied to the light emitting element 703, and the light emitting element 703 emits light by using the supplied current.

SUMMARY OF THE INVENTION

A transistor using polysilicon has high field effect mobility and large on-current. Therefore, it is suited for a light emitting device. However, the transistor using polysilicon has problems in that it is likely to have variations in characteristics due to a defect in a crystal grain boundary.

In the pixel shown in FIG. 7, when the magnitude of the drain current of the driving transistor 701 differs among pixels, the luminance intensity of the light emitting element 703 varies even with the same potential of a video signal.

As a means for controlling variations in drain current, there is a method for enlarging an L/W (L: channel length, W: channel width) of the driving transistor 701 as disclosed in Japanese Laid-Open Patent Application No. 2003-295793. The drain current Ids of the driving transistor 701 in a saturation region is expressed by following formula 1.

$$Ids = â(Vgs - Vth)^2 / 2 \quad \text{(formula 1)}$$

It is apparent from formula 1 that the drain current Ids of the driving transistor 701 in the saturation region is easily fluctuated even by small variations in the gate-source voltage Vgs. Therefore, it is necessary to keep the gate-source voltage Vgs, which is stored between the gate and the source of the driving transistor 701, not to be varied while the light emitting element 701 emits light. Thus, storage capacity of the capacitor 702 which is disposed between the gate and the source of the driving transistor 701 is required to be increased, and off-current of the switching transistor 700 and of the erasing transistor 708 is required to be suppressed low.

It is quite difficult to suppress off-current of the switching transistor 700 and of the erasing transistor 708 low while increasing on-current of the erasing transistor 708 for charging large capacitance in the formation process of the transistor.

Also, there is another problem that the gate-source voltage Vgs of the driving transistor 701 is varied due to the switching of the switching transistor 700 and of the erasing transistor 708, and potential changes in the signal line, scan line, and the like. This derives from a parasitic capacitance on the gate of the driving transistor 701.

In view of the foregoing problems, the invention provides a light emitting device and an element substrate which are not easily influenced by a parasitic capacitance and capable of suppressing variations in luminance intensity of the light emitting element 703 among pixels due to characteristic variations of the driving transistor 701 without suppressing off-current of the switching transistor 700 and of the erasing transistor 708 low and increasing storage capacity of the capacitor 702.

According to the invention, a driving transistor also serves as an erasing transistor and the driving transistor is operated in a saturation region. The gate of the driving transistor is connected to a second scan line and it can be selected whether or not to flow current by a potential of the second scan line. In addition, a current controlling transistor which operates in a linear region is connected in series to the driving transistor, thus a video signal transmitting a light emission or non-emission of a pixel is input to the gate of the current controlling transistor through a switching transistor.

Since the current controlling transistor operates in a linear region, its source-drain voltage Vds is small, and small changes in a gate-source voltage Vgs of the current controlling transistor do not influence the current flowing in a light emitting element. Current flowing in the light emitting element is determined by the driving transistor which operates in a saturation region. A potential of the gate of the driving transistor is a potential of the second scan line, and a potential of the source of the driving transistor is a potential of the drain of the current controlling transistor. The gate-source voltage Vgs of the driving transistor is steady while a light emitting element emits light.

According to the invention, current flowing in a light emitting element is not influenced even without increasing storage capacity of a capacitor which is disposed between the gate and the source of the current controlling transistor or suppressing off-current of the switching transistor low. In addition, it is not influenced by the parasitic capacitance on the gate of the current controlling transistor either. Therefore, cause of variation is decreased, and image quality is thus enhanced to a great extent.

In addition, as there is no need to suppress off-current of the switching transistor low, manufacturing process of the transistor can be simplified, thus contributes greatly to the cost reduction and improvement in yield.

DETAILED DESCRIPTION OF THE PREFERRED EMBODIMENTS

Embodiment mode of the invention is described in detail with reference to the accompanying drawings below.

Embodiment Mode 1

Figure 1:
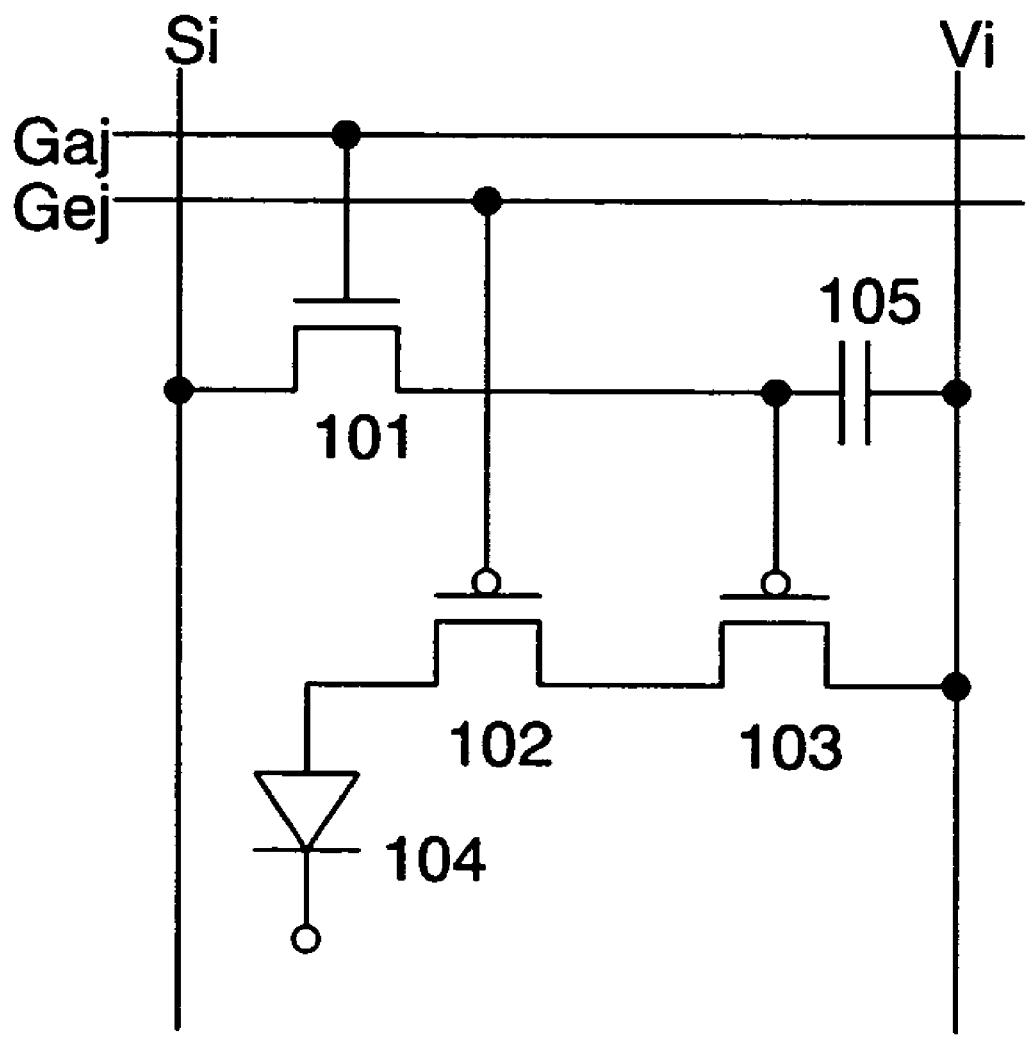
FIG. 1 shows an embodiment mode of the invention.

FIG. 1 shows an embodiment mode of a pixel of the light emitting device of the invention. The pixel shown in FIG. 1 comprises a light emitting element 104, a switching transistor 101 used as a switching element for controlling an input of a video signal to the pixel, a driving transistor 102 for controlling current flowing in the light emitting element 104, and a current controlling transistor 103 for controlling a current supply to the light emitting element 104. In addition, it is also possible to dispose in the pixel a capacitor 105 for storing a potential of a video signal.

The driving transistor 102 and the current controlling transistor 103 have the same conductivity. According to the invention, the driving transistor 102 is operated in a saturation region and the current controlling transistor 103 is operated in a linear region.

The channel length (L) of the driving transistor 102 may be longer than its channel width (W), and L of the current controlling transistor 103 may be equal to or shorter than its W. Desirably, the ratio of L to W (L/W) of the driving transistor 102 is five or more.

Either an enhancement mode transistor or a depletion mode transistor may be used as the driving transistor 102.

In addition, either an N-type transistor or a P-type transistor may be used as the switching transistor 101.

The gate of the switching transistor 101 is connected to a first scan line Gaj (j=1 to y). Either the source or the drain of the switching transistor 101 is connected to a signal line Si (i=1 to x), and the other is connected to the gate of the current controlling transistor 103. The gate of the driving transistor 102 is connected to a second scan line Gej (j=1 to y). The driving transistor 102 and the current controlling transistor 103 are each connected to a power supply line Vi (i=1 to x) and the light emitting element 104 so that a current supplied from the power supply line Vi (i=1 to x) is supplied to the light emitting element 104 as a drain current of the driving transistor 102 and of the current controlling transistor 103. In this embodiment mode, the source of the current controlling transistor 103 is connected to the power supply line Vi (i=1 to x) and the drain of the driving transistor 102 is connected to a pixel electrode of the light emitting element 104.

The light emitting element 104 comprises an anode, a cathode, and a light emitting layer interposed between the anode and the cathode. As shown in FIG. 1, when the anode of the light emitting element 104 is connected to the driving transistor 102, the anode is a pixel electrode and the cathode is a counter electrode. The counter electrode of the light emitting element 104 and the power supply line Vi (i=1 to x) are made to have a potential difference so that current flows into the light emitting element 104 in the forward bias direction.

One of the two electrodes of the capacitor 105 is connected to the power supply line Vi (i=1 to x), and the other is connected to the gate of the current controlling transistor 103. The capacitor 105 is disposed so as to store a potential difference between the two electrodes of the capacitor 105 when the switching transistor 101 is not selected (off state). It is to be noted that although FIG. 1 shows a configuration disposing the capacitor 105, the invention is not limited to this and an alternative configuration without the capacitor 105 may be employed as well.

In FIG. 1, each of the driving transistor 102 and the current controlling transistor 103 is a P-type transistor, and the drain of the driving transistor 102 is connected to the anode of the light emitting element 104. On the contrary, in the case where each of the driving transistor 102 and the current controlling transistor 103 is an N-type transistor, the source of the driving transistor 102 is connected to the cathode of the light emitting element 104. In this case, the cathode of the light emitting element 104 is a pixel electrode and the anode thereof is a counter electrode.

Next, a driving method of the pixel shown in FIG. 1 is described. The operation of the pixel shown in FIG. 1 can be divided into a writing period, an emission period, and a non-emission period.

First, in the writing period, when the first scan line Gaj (j=1 to y) is selected, the switching transistor 101 whose gate is connected to the first scan line Gaj (j=1 to y) is turned ON. Then, a video signal which is input to signal lines S1 to Sx is input to the gate of the current controlling transistor 103 through the switching transistor 101. At the same time, a potential of the video signal is stored by the capacitor 105.

In the emission period, the second scan line Gej (j=1 to y) is selected, and the driving transistor 102 whose gate is connected to the second scan line Gej (j=1 to y) is turned ON. At this time, current is supplied to the light emitting element 104 through the power supply line Vi (i=1 to x) by the potential of the video signal which is stored by the capacitor 105 when the current controlling transistor 103 is turned ON. The current controlling transistor 103 at this time operates in a linear region, therefore, current flowing in the light emitting element 104 is determined by voltage-current characteristics of the driving transistor 102 operating in a saturation region and of the light emitting element 104. The light emitting element 104 emits light at luminance corresponding to the supplied current.

Meanwhile, when the current controlling transistor 103 is turned OFF by a video signal potential which is kept by the capacitor 105, no current is supplied to the light emitting element 104, thus it does not emit light.

In the non-emission period, the driving transistor 102 is turned OFF by the second scan line Gej (j=1 to y). Therefore, no current is supplied to the light-emitting element 104.

It is to be noted that the second scan line Gej (j=1 to y) may be either selected or not selected in the writing period.

Next, description is given on a case where a color image is displayed through a combination of red, blue, and green light emitted from light emitting elements by using a line sequential method in which pixels disposed adjacently to each other in the lateral direction simultaneously emit light or not. To display a color image, there is a method of using different materials for each color, or a method in which a light emitting element emits light through a color filter, and the like. In this case, each color may not be displayed accurately because of the difference of the light emitting materials or the difference in transmittance of each color filter and the like even when current of the same magnitude is supplied to each light emitting element.

It is possible, for example, to dispose a light emitting element which emits light at different luminance intensity for each color by changing L and W of a driving transistor in a pixel.

In addition, such an element can also be provided by changing a threshold voltage of a driving transistor in a pixel.

Figure 2:
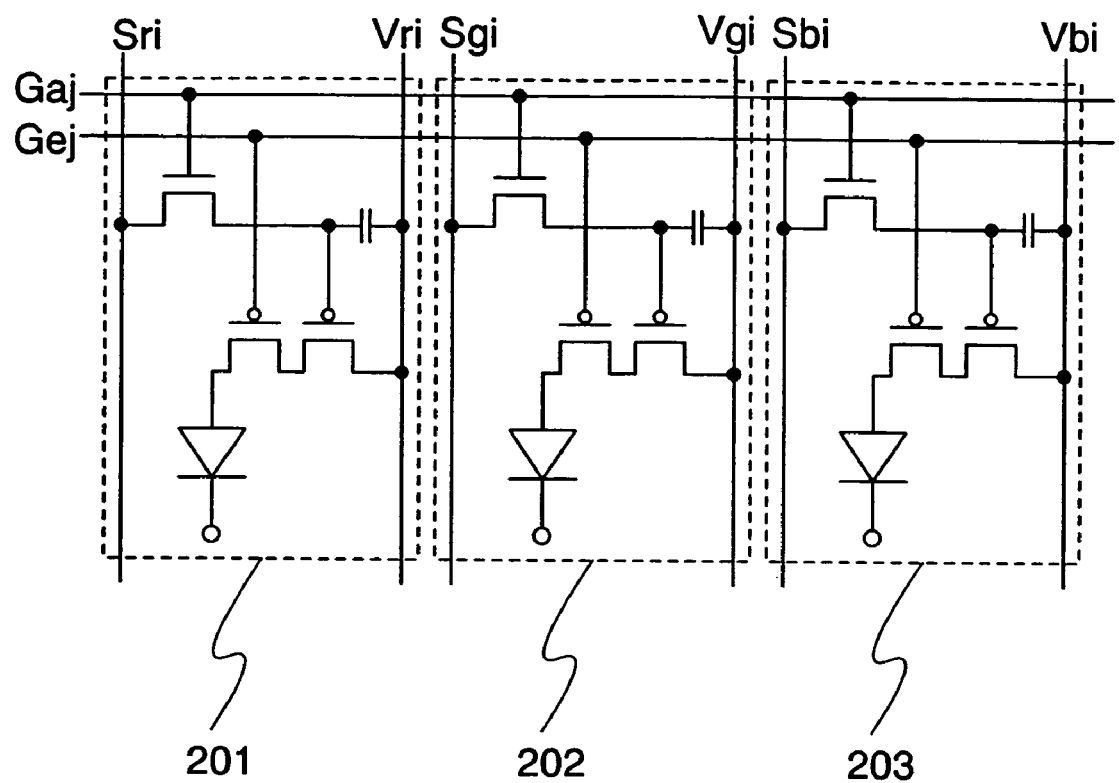
FIG. 2 shows an embodiment mode of the invention.

Configuration of pixels shown in FIG. 2 is described. FIG. 2 comprises a red pixel 201, a green pixel 202, and a blue pixel 203. The gate of a switching transistor in each pixel is connected to a first scan line Gaj (j=1 to y), and the gate of a driving transistor in each pixel is connected to a second scan line Gej (j=1 to y). Either one of the source and the drain of the switching transistor is connected to a signal line Sri (j=1 to x) in the red pixel 201, to a signal line Sgi (i=1 to x) in the green pixel 202, and to a signal line Sbi (i=1 to x) in the blue pixel 203, and the other in each pixel is connected to the gate of a current controlling transistor disposed in each pixel. The source of the current controlling transistor is connected to a power supply line Vri (i=1 to x) in the red pixel 201, to a power supply line Vgi (i=1 to x) in the green pixel 202, and to a power supply line Vbi (i =1 to x) in the blue pixel 203. In this manner, by connecting each color pixel to different power supply lines, a source-gate voltage Vgs of the driving transistor in each pixel can be changed. Thus, current value flowing in the light emitting element can be changed in each color.

Figure 3:
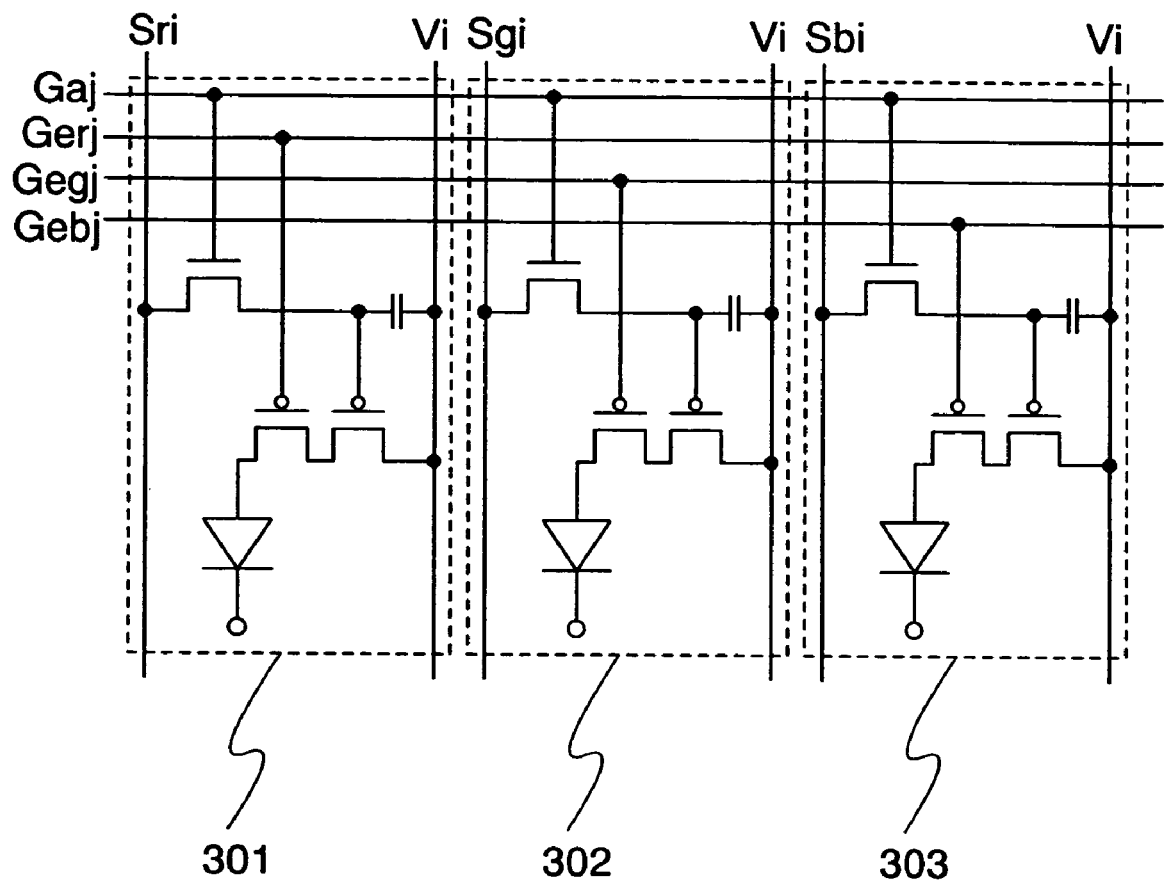
FIG. 3 shows an embodiment mode of the invention.

Configurations of the pixels shown in FIG. 3 is described next. FIG. 3 comprises a red pixel 301, a green pixel 302, and a blue pixel 303. The gate of a switching transistor in each pixel is connected to a first scan line Gaj (j=1 to y), and the source of a driving transistor in each pixel is connected to a power supply line Vi (i=1 to x). Either one of the source and the drain of the switching transistor is connected to a signal line Sri (j=1 to x) in the red pixel 301, to a signal line Sgi (i=1 to x) in the green pixel 302, and to a signal line Sbi (i=1 to x) in the blue pixel 303, and the other in each pixel is connected to the gate of a current controlling transistor disposed in each pixel. The gate of the current controlling transistor 301 is connected to a second scan line Geri (j=1 to y) in the red pixel, to a third scan line Gegj (j=1 to y) in the green pixel 302, and to a fourth scan line Gebj (j=1 to y) in the blue pixel 303. In this manner, by connecting each color pixel to a different power supply line, a source-gate voltage Vgs of the driving transistor in each pixel can be changed. Thus, current value flowing in the light emitting element can be changed in each color.

It is to be noted that an element substrate of the invention corresponds to the condition before the formation of a light emitting element in manufacturing steps of the light emitting device of the invention.

A transistor used in the light emitting device of the invention may be a transistor formed by using a single crystalline silicon or an SOI, a thin film transistor using polycrystalline silicon or amorphous silicon, or a transistor using an organic semiconductor or a carbon nanotube. In addition, a transistor disposed in a pixel of the light emitting device of the invention may be a single gate transistor, a double gate transistor, or a multi-gate transistor having more than two gate electrodes.

According to the above-described configuration, a source-drain voltage Vds of the current controlling transistor 103 is small as the current controlling transistor 103 operates in a linear region, therefore, small changes in a gate-source voltage Vgs of the current controlling transistor 103 do not influence the current flowing in the light emitting element 104. Current flowing in the light emitting element 104 is determined by the driving transistor 102 which operates in a saturation region. A potential of the gate of the driving transistor 102 is a potential of the second scan line, and a potential of the source of the driving transistor 102 is a potential of the drain of the current controlling transistor 103. A gate-source voltage Vgs of the driving transistor 102 is steady while the light emitting element 104 emits light. Thus, Current flowing in the light emitting element 104 is not influenced even without increasing storage capacity of the capacitor 105 which is disposed between the gate and the source of the current controlling transistor 103 or suppressing off-current of the switching transistor 101 low. In addition, it is not influenced by the parasitic capacitance on the gate of the current controlling transistor 103 either. Therefore, cause of variation is decreased, and image quality is thus enhanced to a great extent.

In addition, as there is no need to suppress off-current of the switching transistor 101 low, manufacturing process of the transistor can be simplified, thus serves for the cost reduction and improvement in yield.

Embodiment 1

Described in this embodiment are a configuration of an active matrix display device to which the pixel configuration of the invention is applied and its drive.

Figure 8:
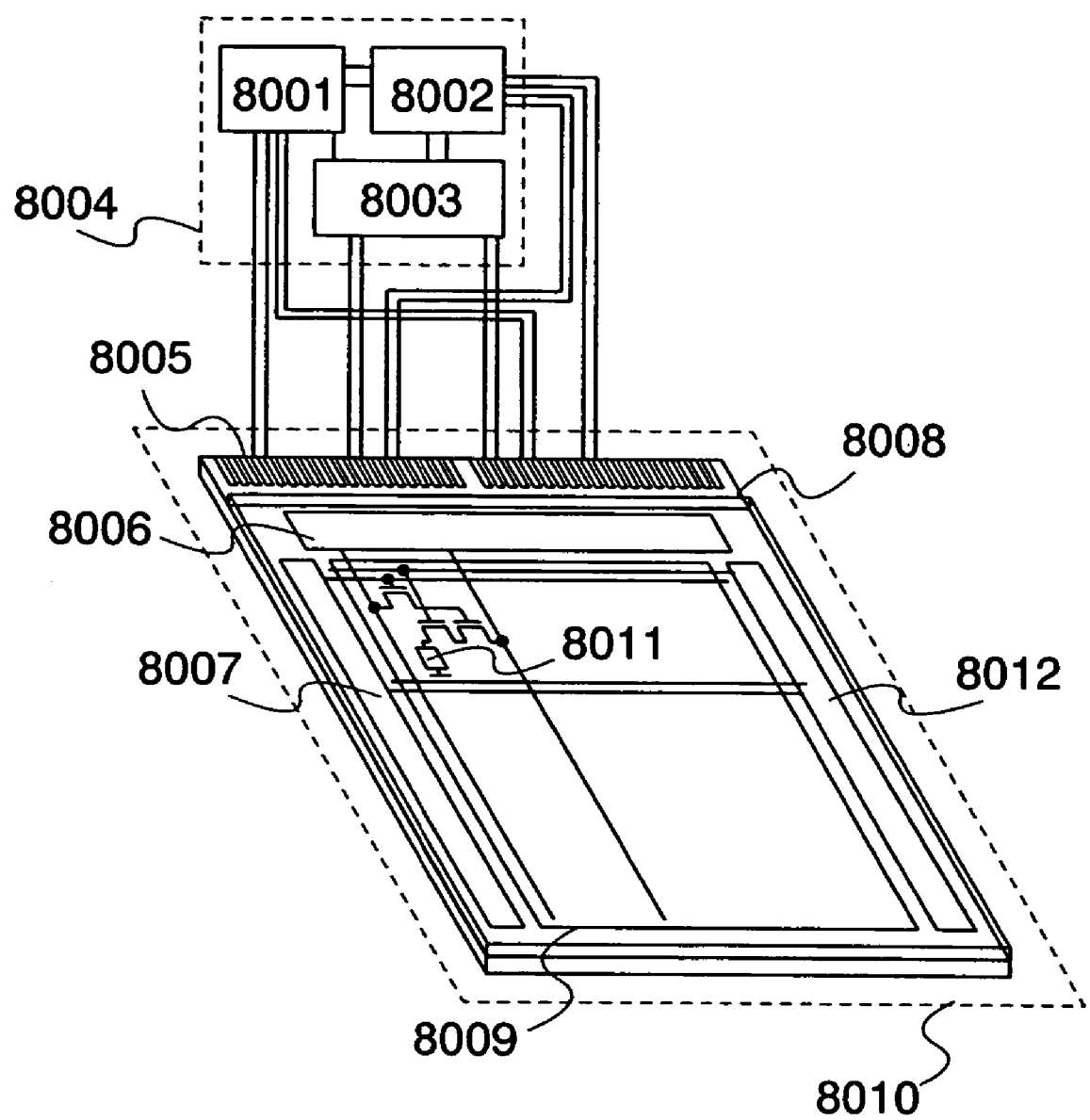
FIG. 8 is a block diagram showing an external circuit and a schematic view of a panel.

FIG. 8 shows a block diagram of an external circuit and a schematic view of a panel.

An active matrix display device shown in FIG. 8 comprises an external circuit 8004 and a panel 8010. The external circuit 8004 comprises an A/D converter unit 8001, a power supply unit 8002, and a signal generator unit 8003. The A/D converter unit 8001 converts an image data signal which is input as an analog signal into a digital signal (video signal), and supplies it to a signal driver circuit 8006. The power supply unit 8002 generates power having a predetermined voltage from the power supplied from a battery or an outlet, and supplies it to the signal driver circuit 8006, a first scan driver circuit 8007, a second scan driver circuit 8012, an OLED 8011, the signal generator unit 8003, and the like. The signal generator unit 8003 is input with power, an image signal, a synchronizing signal, and the like and converts these signals. Also, it generates a clock signal and the like for driving the signal driver circuit 8006, the first scan driver circuit 8007, and the second scan driver circuit 8012.

A signal and power from the external circuit 8004 are input to an internal circuit and the like through an FPC and an FPC connection portion 8005 in the panel 8010.

The panel 8010 comprises the FPC connection portion 8005, the internal circuit, and the OLED 8011 on a substrate 8008. The internal circuit comprises the signal driver circuit 8006, the first scan driver circuit 8007, the second scan driver circuit 8012, and a pixel portion 8009. Any one of pixel configurations described in embodiment modes of the invention may be employed for the pixel portion 8009.

The pixel portion 8009 is disposed in the center of the substrate, and the signal driver circuit 8006, the first scan driver circuit 8007, and the second scan driver circuit 8012 are disposed on the periphery of the pixel portion 8009. The OLED 8011 and a counter electrode of the OLED are formed over the pixel portion 8009.

Figure 4:
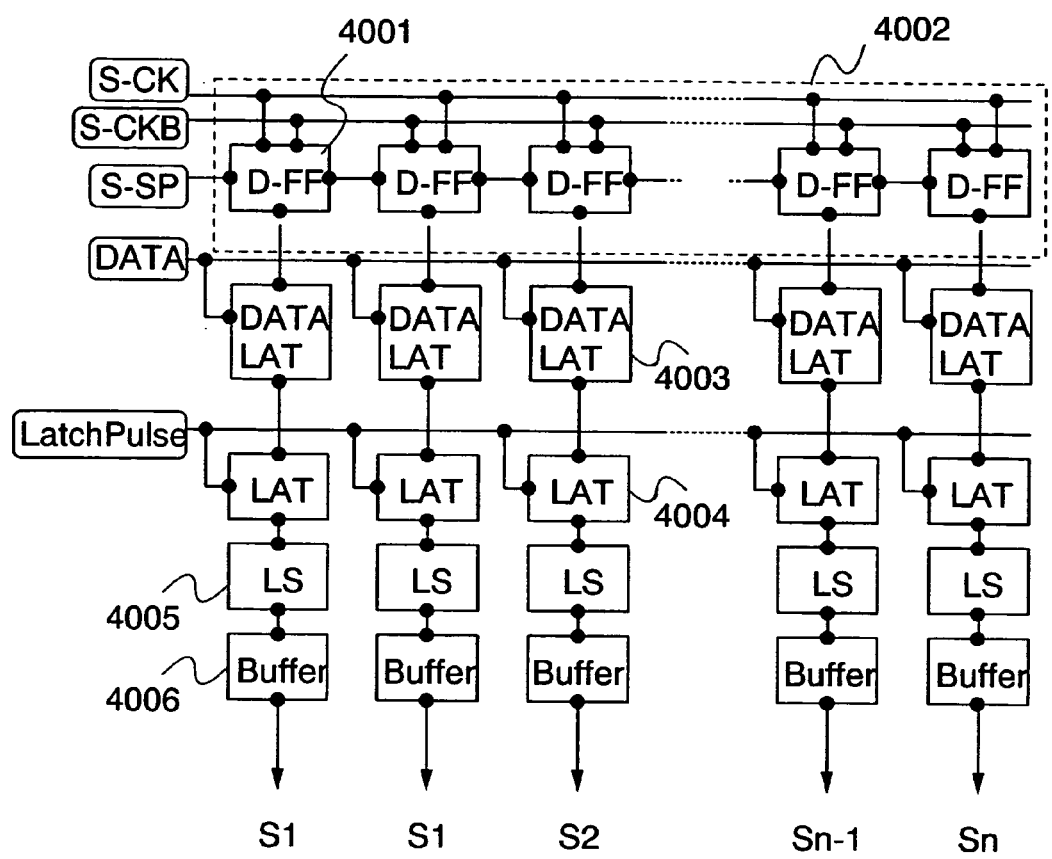
FIG. 4 shows a configuration example of a signal driver circuit.
Figure 9:
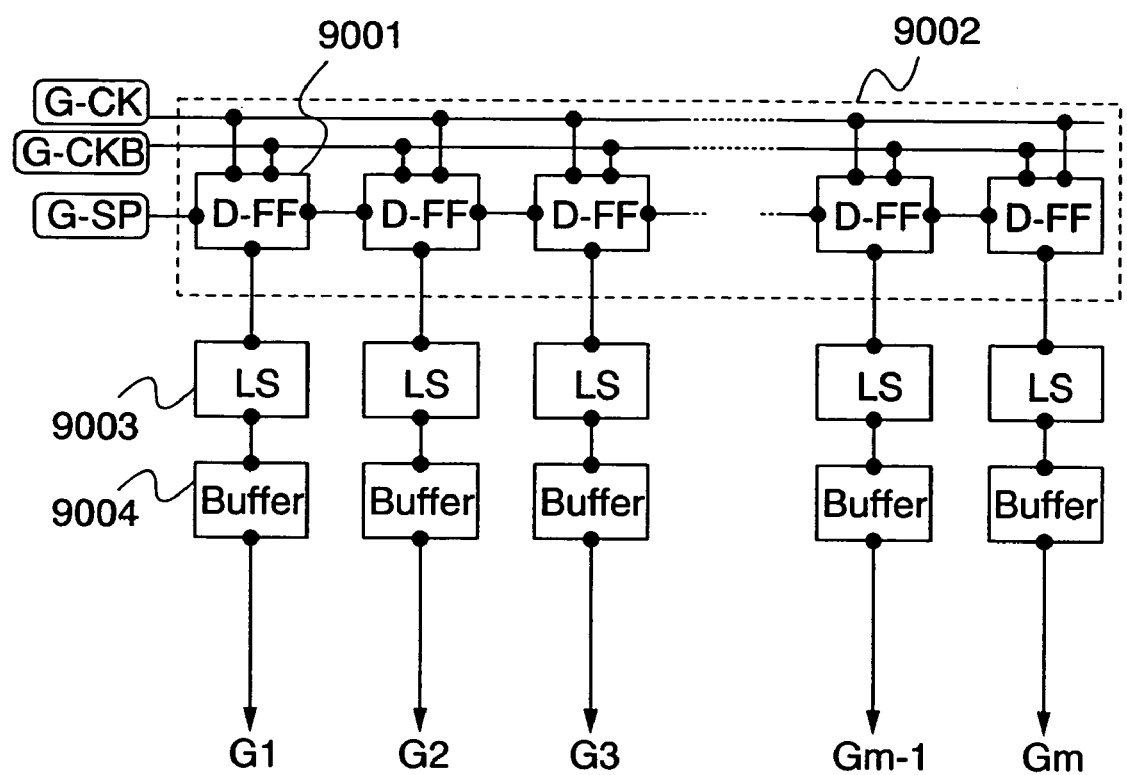
FIG. 9 shows a configuration example of a scan driver circuit.

The operation is explained next with reference to FIGS. 9 and 4. FIG. 9 shows a block diagram of the first scan driver circuit 8007 and FIG. 4 shows a block diagram of the signal driver circuit 8006.

Each of the first scan driver circuit 8007 and the second scan driver circuit 8012 comprises a shift register 9002 including a plurality of stages of D-flip flops 9001, a level shifter 9003, a buffer 9004, and the like.

It is assumed that a clock signal (G-CK), an inverted clock signal (G-CKB), and a start pulse (G-SP), are input. Note that, the configuration of the second scan driver circuit 8012 is the same as that of the first scan driver circuit 8007, however, the timing and pulse width of the start pulse (G-SP) is different from each other.

The signal driver circuit 8006 comprises a shift register 4002 including a plurality of stages of D-flip flops 4001, a data latch circuit 4003, a latch circuit 4004, a level shifter 4005, a buffer 4006, and the like.

It is assumed that a clock signal (S-CK), an inverted clock signal (S-CKB), a start pulse (S-SP), a video signal (DATA), and a latch pulse (Latch Pulse) are input.

First, in accordance with the timing of a clock signal, an inverted clock signal, and a start pulse, a sampling pulse is sequentially output from the shift register 9002 of the first scan driver circuit 8007. Thus, scan lines G1 to Gm are sequentially selected.

Subsequently, the sampling pulse is sequentially output from the shift register 4002 of the signal driver circuit 8006 in accordance with the timing of a clock signal, an inverted clock signal, and a start pulse in accordance with the timing in which the sampling pulse is input to the data latch circuit 4003, a video signal is sampled and thus stored. This operation is sequentially performed from the first column.

When the storage of a video signal is completed in the data latch circuit 4003 on the last stage, a latch pulse is input during a horizontal retrace period, and the video signal stored in the data latch circuit 4003 is transferred to the latch circuit 4004 all at once. Then, it is level-shifted in the level shifter 4005, and adjusted in the buffer 4006 so as to be output to signal lines S1 to Sn all at once. At this time, an H-level or an L-level signal is input to pixels in the row selected by the first scan driver circuits 8007, thereby controlling a light emission or non-emission of the OLED 8011.

Then, in the emission period of the OLED 8011, a potential which turns ON the driving transistor is output from the scan driver circuit 8012 to each second scan line. When the predetermined emission period terminates and proceeds to a non-emission period, a potential which turns OFF the driving transistor is output.

Although the active matrix display device shown in this embodiment comprises the panel 8010 and the external circuit 8004 formed on different substrates, they may be integrally formed on the same substrate. Also, although the display device employs OLED in this embodiment, other light emitting elements can be employed as well. In addition, the level shifter 4005 and the buffer 4006 may not necessarily be provided in the signal driver circuit 8006, and the level shifter 9003 and the buffer 9004 may not necessarily be provided in the first signal driver circuit 8007 and the second scan driver circuit 8012.

Embodiment 2

Figure 10:
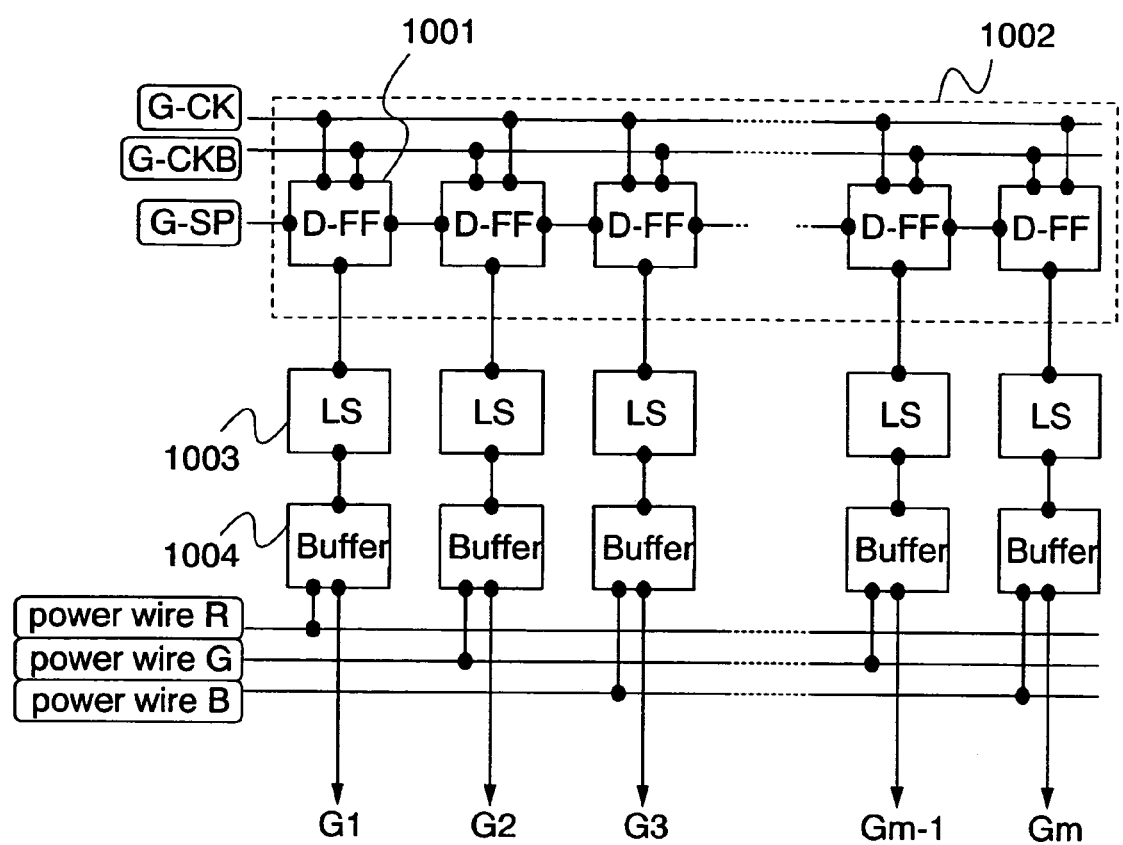
FIG. 10 shows a configuration example of a scan driver circuit.

Described in this embodiment is a second scan driver circuit, which adopts a method for controlling a white balance by applying a different potential to a gate electrode of each driving transistor in the red, green, and blue pixels as described with reference to FIG. 3 in embodiment mode. FIG. 10 shows a block diagram of the second scan driver circuit of this embodiment, and FIG. 3 shows a pixel configuration of this embodiment.

The second scan driver circuit 8012 comprises a shift register 1002 including a plurality of stages of D-flip flops 1001, a level shifter 1003, a buffer 1004, and the like.

It is assumed that a clock signal (G-CK), an inverted clock signal (G-CKB), and a start pulse (G-SP) are input.

The buffers 1004 each connected to scan lines Gerj (j=1 to y), Gegj (j=1 to y), and Gebj (j=1 to y) are connected to different power supply lines. Specifically, the buffer to which the scan line Gerj is connected is connected to a power supply line R, the buffer to which the scan line Gegj is connected is connected to a power supply line G, and the buffer to which the scan line Gebj is connected is connected to a power supply line B. In addition, when the buffer 1004 is not provided, the level shifters 1003 may be each connected to the different power supply lines according to each scan line Gerj, Gegj, and Gebj.

In addition, the scan line Gerj (j=1 to y) is used for erasing the red pixel 301, the scan line Gegj (j=1 to y) is used for erasing the green pixel 302, and the scan line Gebj (j=1 to y) is used for erasing the blue pixel 303.

Embodiment 3

Figure 5:
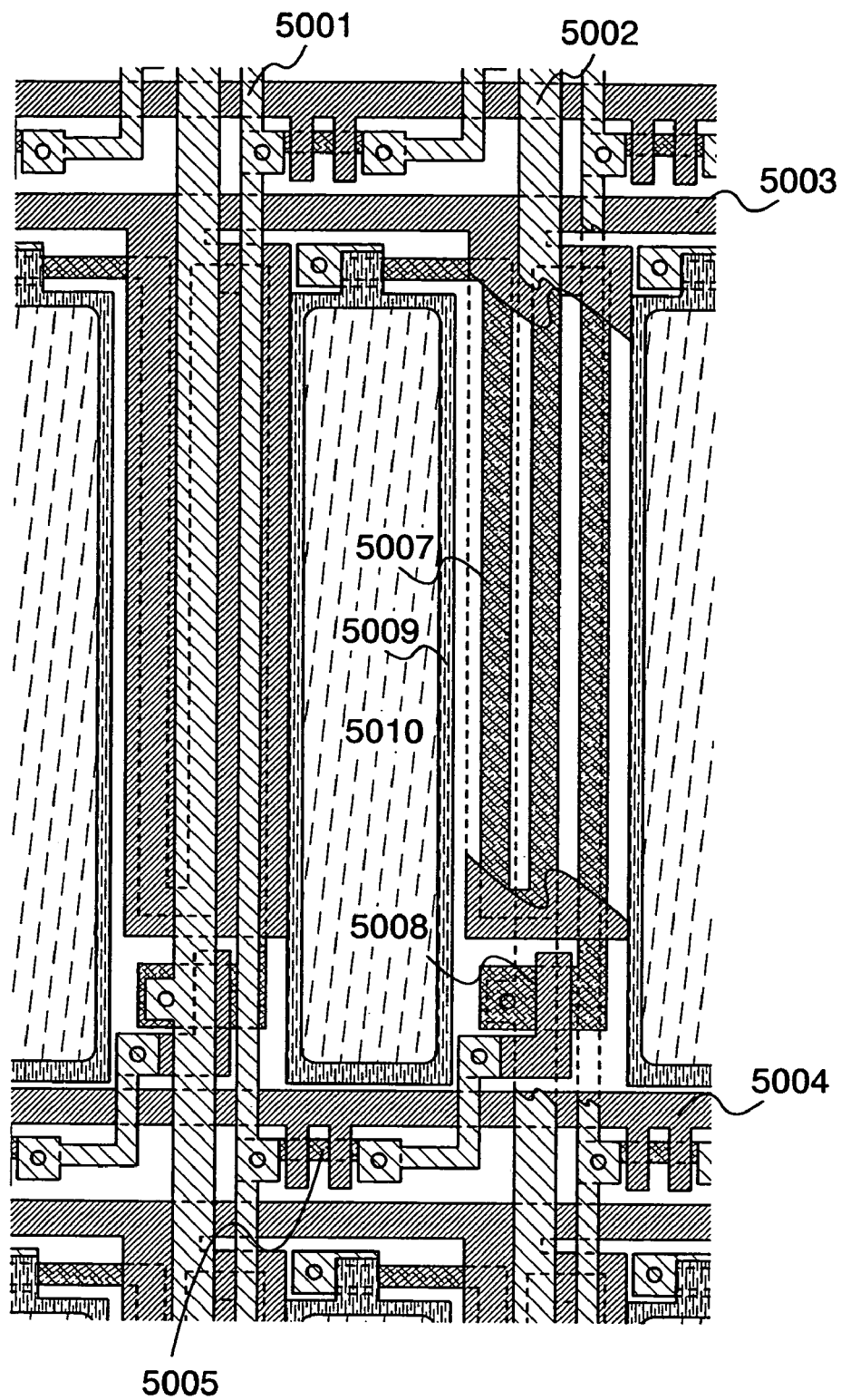
FIG. 5 shows an example showing a top plan view of the invention.

Described in this embodiment is a top plan view of the pixel shown in FIG. 1. FIG. 5 shows a top plan view of the pixel of this embodiment.

Reference numeral 5001 denotes a signal line, 5002 denotes a power supply line, 5004 denotes a first scan line, and 5003 denotes a second scan line. In this embodiment, the signal line 5001 and the power supply line 5002 are formed of the same conductive film, and the first scan line 5004 and the second scan line 5003 are formed of the same conductive film. Reference numeral 5005 denotes a switching transistor, and a part of the first scan line 5004 functions as its gate electrode. Reference numeral 5007 denotes a driving transistor, and a part of the second scan line 5003 functions as its gate electrode. Reference numeral 5008 denotes a current controlling transistor. An active layer of the driving transistor 5007 is curved so that its L/W becomes larger than that of the current controlling transistor 5008. For example, the driving transistor 5007 is formed to have the size of L=200 [im] and W=4[im], and the current controlling transistor 5008 is formed to have the size of L=6 [im] and W=12[im]. Reference numeral 5009 denotes a pixel electrode, and light is emitted in its overlapped area (light emitting area) 5010 with a light emitting layer and a cathode (neither of them is shown).

It is to be noted that the top plan view of the invention shown in this embodiment is only an example, and the invention is, needless to say, not limited to this.

Embodiment 4

Figure 11:
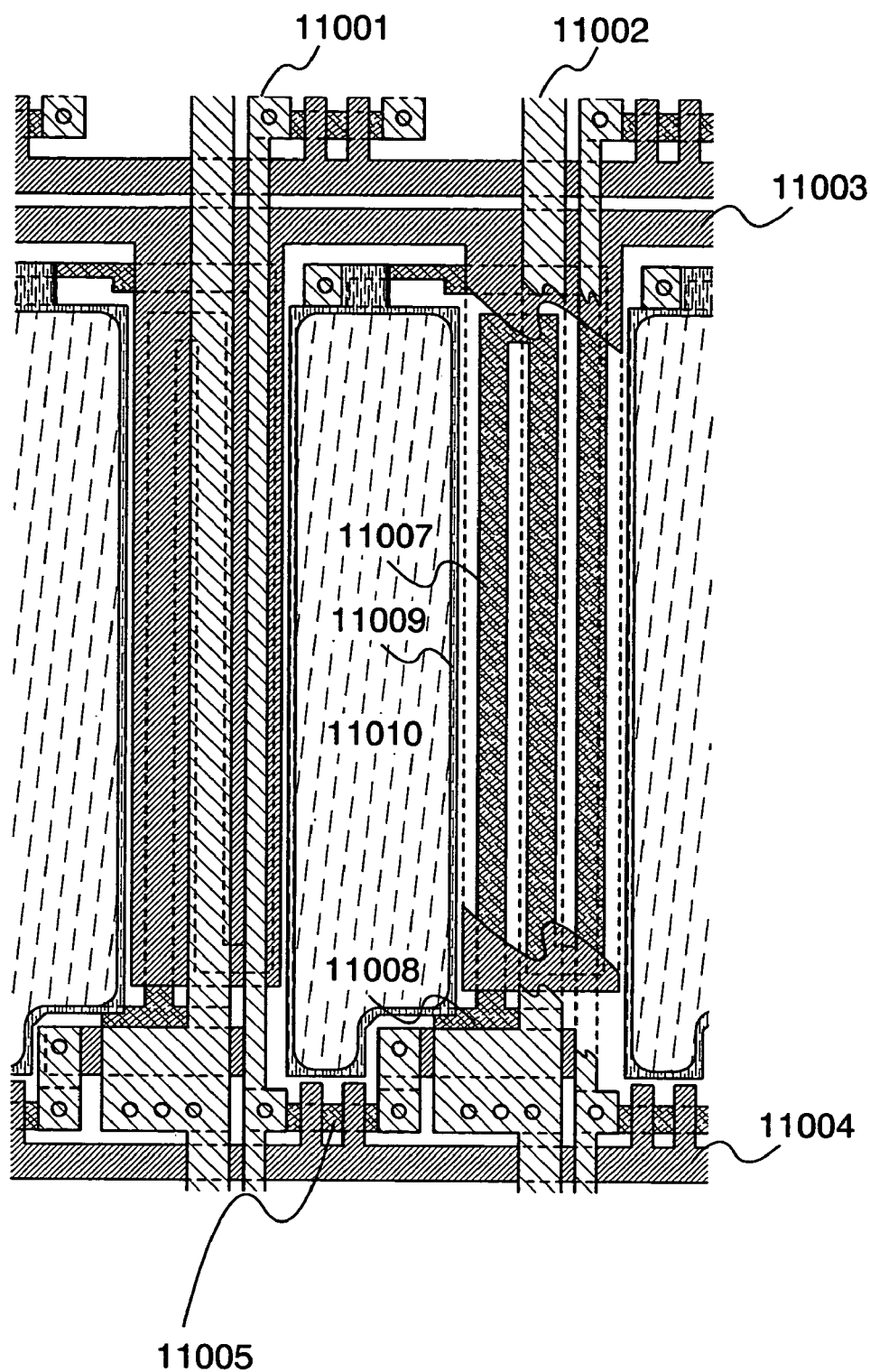
FIG. 11 shows an example showing a top plan view of the invention.

Described in this embodiment is an example of a top plan view of the pixel shown in FIG. 1, which is different from that shown in FIG. 5. FIG. 11 shows a top plan view of a pixel of this embodiment.

Reference numeral 11001 denotes a signal line, 11002 denotes a power supply line, 11004 denotes a first scan line, and 11003 denotes a second scan line. In this embodiment, the signal line 11001 and the power supply line 11002 are formed of the same conductive film, and the first scan line 11004 and the second scan line 11003 are formed of the same conductive film. Reference numeral 11005 denotes a switching transistor, and a part of the first scan line 11004 functions as its gate electrode. Reference numeral 11007 denotes a driving transistor, and a part of the second scan line 11003 functions as its gate electrode. Reference numeral 11008 denotes a current controlling transistor. An active layer of the driving transistor 11007 is curved so that its L/W becomes larger than that of the current controlling transistor 11008. For example, the driving transistor 11007 is formed to have the size of L=200 [im] and W=4[im], and the current controlling transistor 11008 is formed to have the size of L=6 [im] and W=12[im]. Reference numeral 11009 denotes a pixel electrode, and light is emitted in its overlapped area (light emitting area) 11010 with a light emitting layer and a cathode (neither of them is shown).

It is to be noted that the top plan view of the invention shown in this embodiment is only an example, and the invention is, needless to say, not limited to this.

Embodiment 5

Described in this embodiment is a cross-sectional structure of a pixel.

Figure 12A:
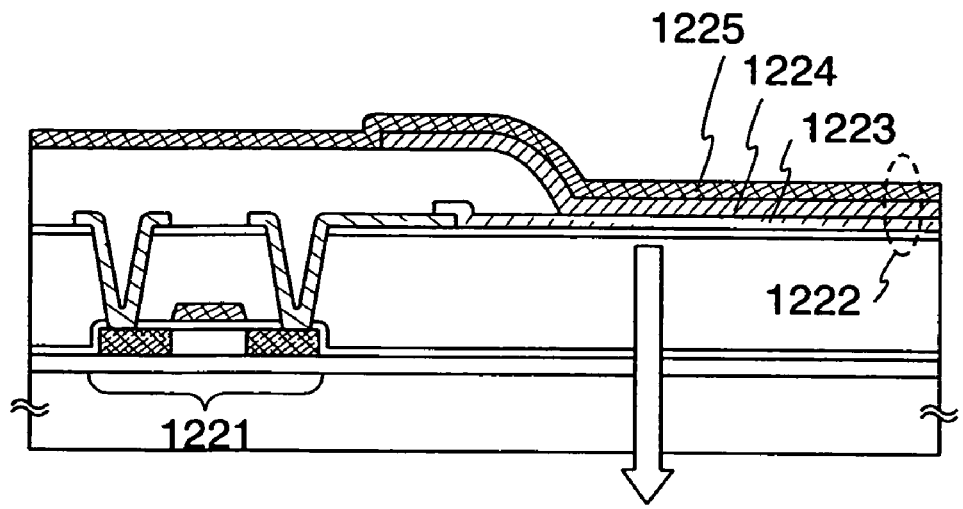
FIGS. 12A and 12B show examples showing a cross-sectional structures of the invention.

FIG. 12A shows a cross-sectional view of a pixel in which a driving transistor 1221 is a P-type transistor and light emitted from a light emitting element 1222 is transmitted to an anode 1223 side. In FIG. 12A, the anode 1223 of the light emitting element 1222 is electrically connected to the driving transistor 1221, and a light emitting layer 1224 and a cathode 1225 are laminated on the anode 1223 in this order. As for the cathode 1225, known material can be used as long as it is a conductive film having a small work function and reflecting light. For example, Ca, Al, CaF, MgAg, AlLi, and the like are desirably used. The light emitting layer 1224 may be composed of a single layer or multiple layers. When it is composed of multiple layers, a hole injection layer, a hole transporting layer, a light emitting layer, an electron transporting layer, and an electron injection layer are sequentially laminated in this order on the cathode 1223. It is to be noted that not all of the above layers are necessarily provided. The anode 1223 may be formed of a transparent conductive film which transmits light, such as the one comprising ITO or the one in which indium oxide is mixed with zinc oxide (ZnO) of 2 to 20%.

The overlapped portion of the anode 1223, the light emitting layer 1224, and the cathode 1225 corresponds to the light emitting element 1222. In the case of the pixel shown in FIG. 12A, light emitted from the light emitting element 1222 is transmitted to the anode 1223 side as shown by an outline arrow.

Figure 12B:
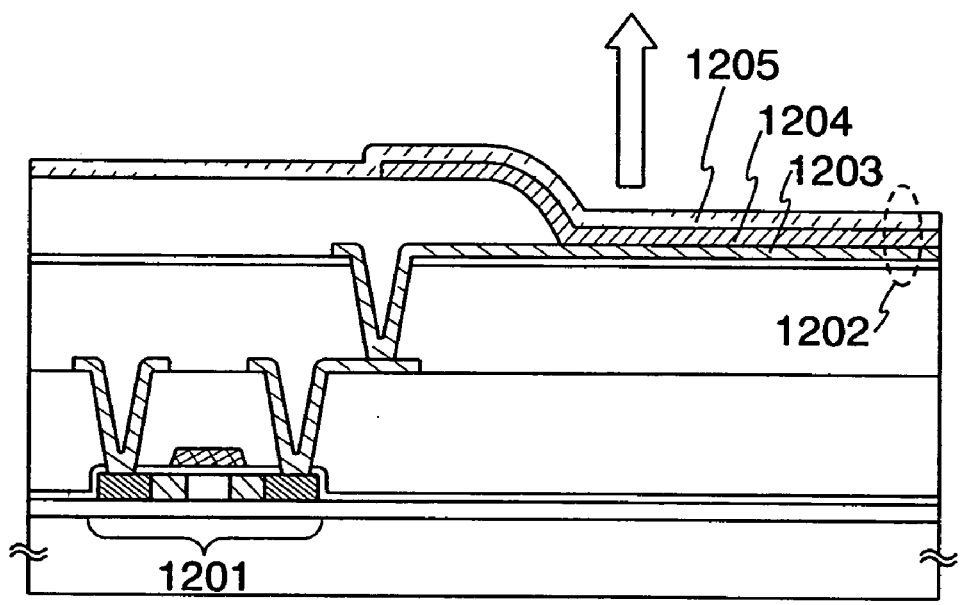

FIG. 12B shows a cross-sectional view of a pixel in which a driving transistor 1201 is an N-type transistor and light emitted from a light emitting element 1202 is transmitted to an anode 1205 side. In FIG. 12B, a cathode 1203 of the light emitting element 1202 is electrically connected to the driving transistor 1201, and a light emitting layer 1204 and an anode 1205 are laminated on the cathode 1203 in this order. As for the cathode 1203, known material can be used as long as it is a conductive film having a small work function and reflecting light. For example, Ca, Al, CaF, MgAg, AlLi, and the like are desirably used. The light emitting layer 1204 may be composed of a single layer or multiple layers. When it is composed of multiple layers, a hole injection layer, a hole transporting layer, a light emitting layer, an electron transporting layer, and an electron injection layer are sequentially laminated in this order on the cathode 1203. It is to be noted that not all the above layers are necessarily provided. The anode 1205 may be formed of a transparent conductive film which transmits light, such as the one comprising ITO or the one in which indium oxide is mixed with zinc oxide (ZnO) of 2 to 20%.

The overlapped portion of the anode 1203, the light emitting layer 1204, and the cathode 1205 corresponds to the light emitting element 1202. In the case of the pixel shown in FIG. 12B, light emitted from the light emitting element 1202 is transmitted to the anode 1205 side as shown by an outline arrow.

It is to be noted that although shown in this embodiment is the one in which a driving transistor is electrically connected to a light emitting element, a current controlling transistor may be interposed between the driving transistor and the light emitting element.

Embodiment 6

Described in this embodiment is an example of the drive timing for which the pixel configuration of the invention is employed.

Figure 13:
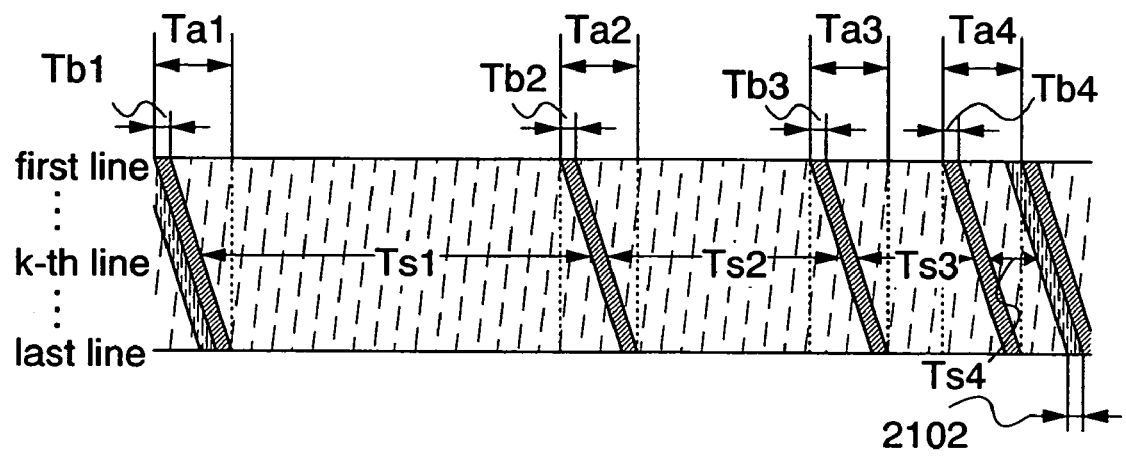
FIG. 13 shows an example showing the operation timing of the invention.

FIG. 13 shows an example using a digital time gray scale method for a 4-bit gray scale display. In data storage periods Ts1 to Ts4, the ratio of the time length is assumed to be Ts1:Ts2:Ts3:Ts4=$2^3:2^2:2^1:2^0$=8:4:2:1.

The operation is described now. First, in a writing period of the first row Tb1, the first scan line is selected from the first row in sequence, thereby turning ON the switching transistor. Next, a video signal is input to each pixel from a signal line, thereby controlling a light emission or non-light emission of each pixel according to a potential of the signal. Once the video signal is written, that row proceeds to the data storage period Ts1 immediately. The same operation is performed up to the last row, and thus a total writing period Ta1 terminates. Subsequently, a writing period Tb2 is started from the row in which data storage period Ts1 is complete in sequence.

In the sub-frame period Ts having the shorter data storage period than the total writing period Ta (corresponds to period Ts4 here), an erasing period 2102 is provided so that a next writing period is not started immediately after the data storage period. In the erasing period 2102, a light emitting element is forced to be in a non-emission state.

Taken as an example here is the case of expressing a 4-bit gray scale display, however the number of bits and gray scales is not limited to this. In addition, a light emission is not necessarily performed from Ts1 to Ts4 in sequence. It may be performed at random, or divided into a plurality of periods.

Embodiment 7

The display device of the invention can be used in display portions of various electronic apparatuses. In particular, the display device of the invention is desirably applied to a mobile device that requires low power consumption.

Electronic apparatuses using the display device of the invention include a portable information device (a cellular phone, a mobile computer, a portable game machine, an electronic book, and the like), a video camera, a digital camera, a goggle display, a display device, a navigation system, and the like. Specific examples of these electronic apparatuses are shown in FIGS. 6A to 6D.

Figure 6A:
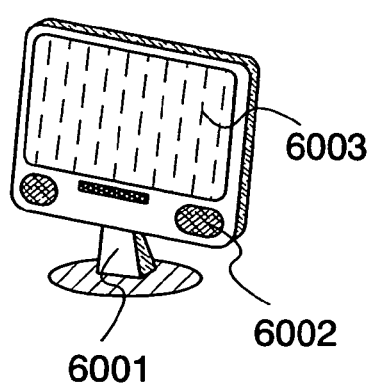
FIGS. 6A to 6D are views showing electronic apparatuses to which the invention is applied.

FIG. 6A shows a display device which includes a housing 6001, an audio output portion 6002, a display portion 6003, and the like. The display device of the invention can be used for the display portion 6003. Note that, the display device includes all the information display devices for personal computers, television broadcast reception, advertisement displays, and the like.

Figure 6B:
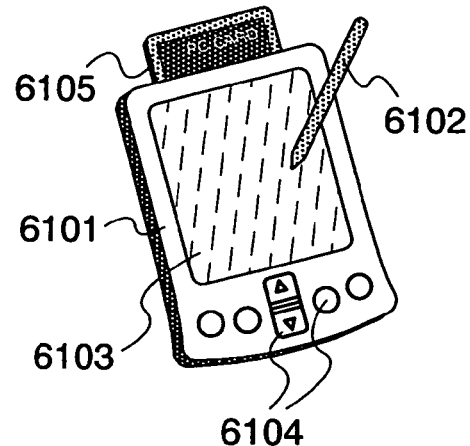

FIG. 6B shows a mobile computer which includes a main body 6101, a stylus 6102, a display portion 6103, operation keys 6104, an external interface 6105, and the like. The display device of the invention can be used for the display portion 6103.

Figure 6C:
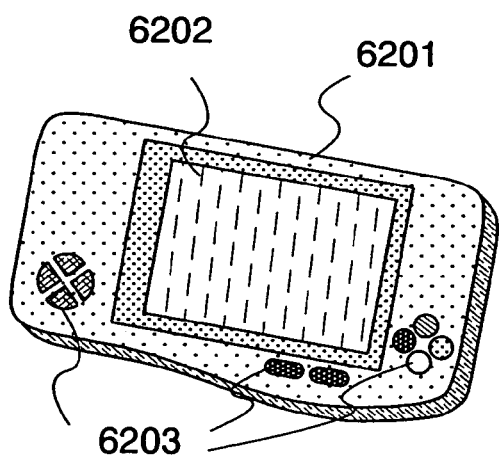

FIG. 6C shows a game machine which includes a main body 6201, a display portion 6202, operation keys 6203, and the like. The display device of the invention can be used for the display portion 6202.

Figure 6D:
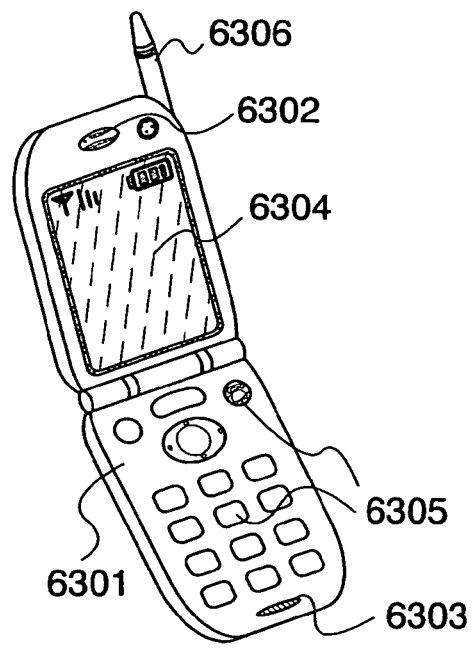
Figure 7:
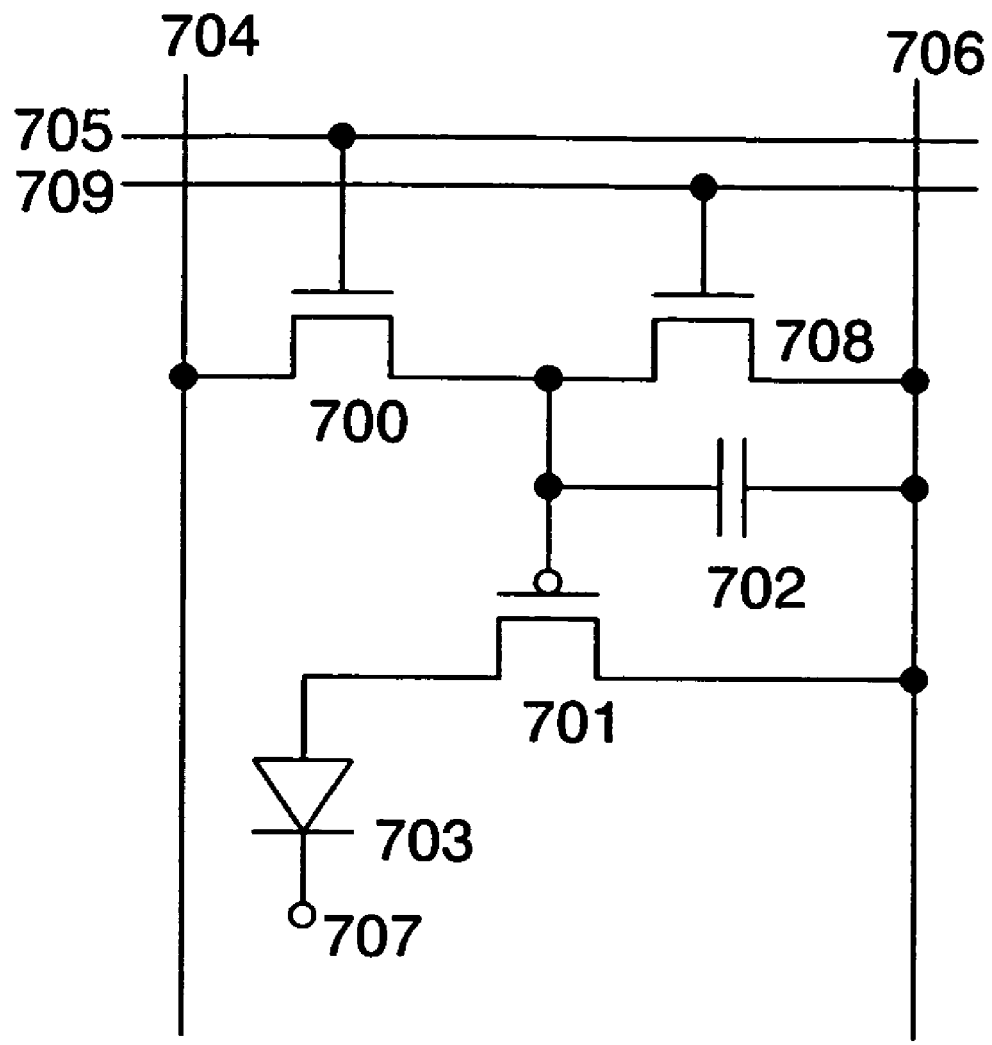
FIG. 7 is a diagram showing a conventional technology.

FIG. 6D shows a cellular phone which includes a main body 6301, an audio output portion 6302, a display portion 6304, operation switches 6305, an antenna 6306, and the like. The display device of the invention can be used for the display portion 6304.

As described above, an application range of the invention is so wide that the invention can be applied to electronic apparatuses in various fields.

Although the invention has been fully described by way of example with reference to the accompanying drawings, it is to be understood that various modifications will be apparent to those skilled in the art. Therefore, unless otherwise such changes and modifications depart from the scope of the invention hereinafter defined, they should be construed as being included therein.

What is claimed is:

1. A light emitting device with a pixel comprising:
    a light emitting element;
    a first transistor for determining a current value flowing in the light emitting element;
    a second transistor for determining a light emission or non-emission of the light emitting element according to a video signal; and
    a third transistor for determining an input of the video signal,
    wherein the light emitting element is connected in series to the first transistor and the second transistor between a first power supply and a third power supply,
    wherein a gate electrode of the third transistor is connected to a first scan line,
    wherein a gate electrode of the first transistor is connected to a second scan line, and
    wherein the first transistor is operated in a saturation region and the second transistor is operated in a linear region.

2. The light emitting device according to claim 1, wherein each of the first transistor and the second transistor has the same conductivity.

3. The light emitting device according to claim 1, wherein the first transistor is a depletion mode transistor.

4. The light emitting device according to claim 1, wherein a channel length of the first transistor is longer than its channel width, and a channel length of the second transistor is equal to or shorter than its channel width.

5. The light emitting device according to claim 4, a ratio of the channel length to the channel width of the first transistor is five or more.

6. An element substrate comprising a pixel comprising:
    a pixel electrode;
    a first transistor for determining a current value flowing in the light emitting element;
    a second transistor for determining a light emission or non-emission of the light emitting element according to a video signal; and
    a third transistor for controlling an input of the video signal,
    wherein the first transistor is connected in series to the second transistor between a first power supply and a third power supply,
    a gate electrode of the third transistor is connected to a first scan line,
    a gate electrode of the first transistor is connected to a second scan line, and
    wherein the first transistor is operated in a saturation region and the second transistor is operated in a linear region.

7. The element substrate according to claim 6, wherein each of the first transistor and the second transistor has the same conductivity.

8. The element substrate according to claim 6, wherein the first transistor is a depletion mode transistor.

9. The element substrate according to claim 6, wherein a channel length of the first transistor is longer than its channel width, and a channel length of the second transistor is equal to or shorter than its channel width.

10. The element substrate according to claim 9, a ratio of the channel length to the channel width of the first transistor is five or more.

* * * * *